(12) United States Patent
Hayashi et al.

(10) Patent No.: US 10,998,295 B2
(45) Date of Patent: May 4, 2021

(54) SEMICONDUCTOR DEVICE

(71) Applicant: DENSO CORPORATION, Kariya (JP)

(72) Inventors: Hiromasa Hayashi, Kariya (JP);
Shunsuke Tomoto, Kariya (JP);
Yusuke Mori, Kariya (JP)

(73) Assignee: DENSO CORPORATION, Kariya (JP)

( * ) Notice: Subject to any disclaimer, the term of this patent is extended or adjusted under 35 U.S.C. 154(b) by 123 days.

(21) Appl. No.: 16/360,341

(22) Filed: Mar. 21, 2019

(65) Prior Publication Data

US 2019/0221549 A1 Jul. 18, 2019

Related U.S. Application Data

(63) Continuation of application No. PCT/JP2017/034829, filed on Sep. 27, 2017.

(30) Foreign Application Priority Data

Oct. 7, 2016 (JP) .............................. JP2016-199127

(51) Int. Cl.
*H01L 25/00* (2006.01)
*H01L 25/07* (2006.01)
(Continued)

(52) U.S. Cl.
CPC .......... *H01L 25/072* (2013.01); *G01R 15/146* (2013.01); *G01R 19/0092* (2013.01);
(Continued)

(58) Field of Classification Search
CPC . H01L 25/072; H01L 25/07; H01L 23/49562; H01L 25/18; H01L 23/49524; H01L 23/48; H01L 23/49541; H01L 23/3121; H01L 23/4006; H01L 23/49575; H01L 24/48; H01L 2224/40137;
(Continued)

(56) References Cited

U.S. PATENT DOCUMENTS 8,039,954 B2 * 10/2011 Osawa .............. H01L 23/49575
257/723
9,786,577 B2 * 10/2017 Terasaki .................. H01L 31/04
(Continued)

FOREIGN PATENT DOCUMENTS

| JP | 2003-199350 A | 7/2003 |
| JP | 2010-181351 A | 8/2010 |
| WO | 2016/075985 A1 | 5/2016 |

*Primary Examiner* — Vu A Vu
(74) *Attorney, Agent, or Firm* — Posz Law Group, PLC

(57) ABSTRACT

A semiconductor device includes: a first chip to restrict current flow in a first direction through a current path; a second chip to restrict the current flow in a second direction opposite to the first direction, through the current path; a wiring having one end connected to the first chip and the other end connected to the second chip, and provided as a part of the current path by relaying the first chip and the second chip; a lead frame having a first lead arranged and fixed with the first chip and a second lead is arranged and fixed with the second chip; and molding resin sealing the first chip, the second chip, the wiring and the lead frame. The wiring is a shunt resistor having a resistive body. The lead frame further has a sense terminal to detect a voltage drop across the resistive body.

7 Claims, 5 Drawing Sheets

(51) Int. Cl.
  *H01L 23/495* (2006.01)
  *H01L 23/31* (2006.01)
  *H01L 23/40* (2006.01)
  *G01R 19/00* (2006.01)
  *G01R 15/14* (2006.01)
  *H01L 23/00* (2006.01)
  *H01L 25/18* (2006.01)
  *H01L 23/48* (2006.01)

(52) U.S. Cl.
  CPC ...... *H01L 23/3121* (2013.01); *H01L 23/4006* (2013.01); *H01L 23/48* (2013.01); *H01L 23/49524* (2013.01); *H01L 23/49541* (2013.01); *H01L 23/49562* (2013.01); *H01L 23/49575* (2013.01); *H01L 24/48* (2013.01); *H01L 25/07* (2013.01); *H01L 25/18* (2013.01); *H01L 2023/4031* (2013.01); *H01L 2023/4087* (2013.01); *H01L 2224/40137* (2013.01); *H01L 2224/45111* (2013.01); *H01L 2224/45147* (2013.01); *H01L 2224/45149* (2013.01); *H01L 2224/45155* (2013.01); *H01L 2224/48137* (2013.01); *H01L 2224/48247* (2013.01); *H01L 2924/13055* (2013.01); *H01L 2924/13091* (2013.01); *H01L 2924/18301* (2013.01)

(58) Field of Classification Search
  CPC . H01L 2924/13055; H01L 2924/13091; H01L 2924/18301; H01L 2224/48247; H01L 2023/4087; H01L 2023/4031; H01L 2224/48137; H01L 2224/45111; H01L 2224/45147; H01L 2224/45155; H01L 2224/45149; H01L 2224/37111; H01L 2224/834; H01L 2224/37155; H01L 2224/40499; H01L 2224/45099; H01L 2224/37149; H01L 2224/37147; H01L 2224/05599; H01L 24/73; H01L 24/40; H01L 2224/32245; H01L 2924/19104; H01L 2924/19043; H01L 24/06; H01L 24/29; H01L 24/32; H01L 2924/1815; H01L 2224/73263; H01L 2224/291; H01L 2224/06181; H01L 24/37; H01L 2224/73221; H01L 2224/04034; H01L 2224/04042; H01L 2924/19107; H01L 23/3107; G01R 19/0092; G01R 15/146; G01R 1/203
  USPC .......................................................... 257/48
  See application file for complete search history.

(56) References Cited

U.S. PATENT DOCUMENTS

| 2010/0289127 | A1 | 11/2010 | Kanazawa et al. |
| 2012/0267682 | A1 | 10/2012 | Kanazawa et al. |
| 2013/0221532 | A1 | 8/2013 | Fujita et al. |
| 2016/0261132 | A1* | 9/2016 | Uan-Zo-Li ............... H02J 7/007 |
| 2017/0141567 | A1* | 5/2017 | Basler .................... H02H 9/046 |

* cited by examiner

SEMICONDUCTOR DEVICE

CROSS REFERENCE TO RELATED APPLICATIONS

The present application is a continuation application of International Patent Application No. PCT/JP2017/034829 filed on Sep. 27, 2017, which designated the U.S. and claims the benefit of priority from Japanese Patent Application No. 2016-199127 filed on Oct. 7, 2016. The entire disclosures of all of the above applications are incorporated herein by reference.

TECHNICAL FIELD

The present disclosure relates to a semiconductor device.

BACKGROUND

A three-phase AC-DC converter includes a bidirectional switch and a current detector. The bidirectional switch includes a pair of switching elements connected to each other. The bidirectional switch restricts current flow through a current path when both of the switching elements are turned off. The current detector is connected to one of the switching elements and is configured to detect a current flowing through the bidirectional switch.

SUMMARY

The present disclosure provides a semiconductor device, which includes a plurality of chips each having a semiconductor element and a wiring connecting the plurality of chips.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
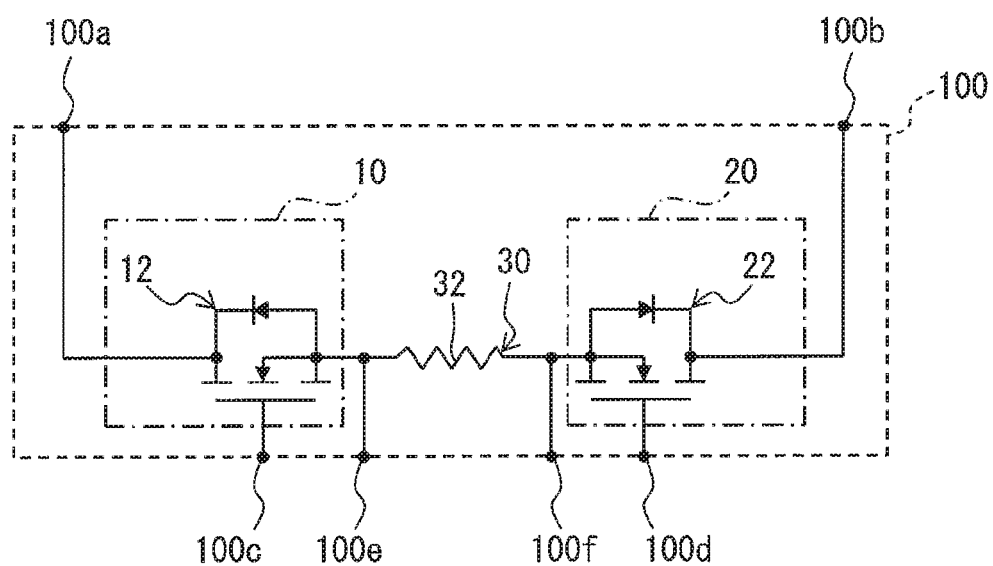
FIG. 1 is a circuit diagram that illustrates the schematic configuration of a semiconductor device according to a first embodiment.

In a situation where a vertical-type element is used as a switching element, a structure in which two switching elements are respectively provided at different chips is adopted as a configuration of a bidirectional switch. For this situation, a wiring for connecting the chips is essential. Thus, it is required to design a wiring for connecting the chips in addition to the plurality of chips and the current detector. This may cause an increase in the number of parts of a three-phase AC-DC converter.

A semiconductor device according to an aspect of the present disclosure is connected to a current path through which a current flows bidirectionally, and is provided as a part of the current path. The semiconductor device includes: a first chip that has a first switching element to restrict current flow in a first direction through the current path when the first switching element is turned off, and a second chip that has a second switching element to restrict the current flow in a second direction, which is opposite to the first direction, through the current path when the second switching element is turned off; a wiring that has one end connected to the first chip and another end connected to the second chip, and that is provides as a part of the current path by relaying the first chip and the second chip; a lead frame that includes a first lead arranged and fixed with the first chip and a second lead arranged and fixed with the second chip, and that provides the current path; and molding resin that integrally seals the first chip, the second chip, the wiring and the lead frame. The wiring is a shunt resistor that has a resistive body to detect the current flowing through the current path. The lead frame further includes a sense terminal connected to both ends of the resistive body of the wiring to detect a voltage drop across the resistive body In the configuration as mentioned above, the first chip and the second chip are connected by a shunt resistor for detecting a current flowing through the current path. Accordingly, the wiring can be omitted as compared with the configuration in which the shunt resistor is provided separately from the wiring connecting the first chip and the second chip. Thus, it is possible to restrict an increase in the number of parts of the semiconductor device.

The following describes embodiments of the present disclosure with reference to the drawings. It should be noted that in the detailed description that follows, identical components have the same reference numerals, regardless of whether they are shown in different embodiments of the present embodiments. The thickness direction of a lead frame is indicated as a Z-direction. The specific direction perpendicular to the Z-direction is indicated as an X-direction. The direction perpendicular to the Z-direction and the X-direction is indicated as a Y-direction.

First Embodiment

First, the circuit configuration of a semiconductor device 100 is described based on FIG. 1.

The semiconductor device 100 is connected to a current path through which a current flows bidirectionally, and forms a part of the current path. The semiconductor device 100 is applied to, for example, a power supply system including a lithium battery and a lead battery or a system including an ISG and a lithium battery. It is noted that ISG stands for Integrated Starter Generator.

The semiconductor device 100 includes a first chip 10, a second chip 20 and a shunt resistor 30. The semiconductor device 100 may also be referred to as a semiconductor module. The semiconductor device 100 includes a first terminal 100a, a second terminal 100b, control terminals 100c, 100d, and sense terminals 100e, 100f as the terminals of the semiconductor device 100.

The first chip 10 includes a first switching element 12. The second chip 20 includes a second switching element 22. The switching elements 12, 22 are elements for controlling whether to allow a current flowing through the current path. The switching elements 12, 22 are vertical-type semiconductor elements. In the present embodiment, the switching elements 12, 22 are MOSFETs.

The first switching element 12 has a parasitic diode. The cathode of the parasitic diode is connected to the drain of the first switching element 12, and the anode of the parasitic diode is connected to the source of the first switching element 12. As the first switching element 12 is turned off, the path of the current flowing through the first switching element 12 is limited only to the path that flows from the anode of the parasitic diode to the cathode of the parasitic diode. That is, the first switching element 12 restricts the flow of current in one direction in the current path when the first switching element 12 is turned off.

The drain of the first switching element 12 is connected to the first terminal 100*a*. The first terminal 100*a* is connected to an external wiring. The gate of the first switching element 12 is connected to the control terminal 100*c*. The source of the first switching element 12 is connected to one end of the shunt resistor 30. Elements other than the first switching element 12 such as a temperature sensing diode may also be arranged at the first chip 10.

Similar to the first switching element 12, the second switching element 22 includes a parasitic diode. The cathode of the parasitic diode is connected to the drain of the second switching element 22, and the anode of the parasitic diode is connected to the source of the second switching element 22. The path of the current flowing through the second switching element 22 is limited only to the path that flows from the anode to the cathode of the parasitic diode, when the second switching element 22 is turned off.

The direction of the current flowing through the parasitic diode of the first switching element 12 to the current path formed by the semiconductor device 100 is opposite to the direction of the current flowing through the parasitic diode of the second switching element 22. As a result, when the second switching element 22 is turned off, the second switching element 22 restricts the flow of current in the direction opposite to the direction of the current flow restricted by the first switching element 12 in the current path.

The drain of the second switching element 22 is connected to the second terminal 100*b*. The second terminal 100*b* is connected to an external wiring. The gate of the second switching element 22 is connected to the control terminal 100*d*. The source of the second switching element 22 is connected to a terminal of the shunt resistor 30 opposite to the terminal connected with the first switching element 12. Elements other than the second switching element 22 such as a temperature sensing diode may also be formed at the second chip 20.

The shunt resistor 30 electrically relays the first switching element 12 and the second switching element 22 to form a part of the current path. The shunt resistor 30 corresponds to a wiring.

The shunt resistor 30 includes a resistive body 32 for detecting a current flowing through the current path. The connection point between the source of the first switching element 12 and the shunt resistor 30 is connected to the sense terminal 100*e*. The source of the second switching element 22 and the shunt resistor 30 are connected to the sense terminal 100*f*.

The resistive body 32 is arranged between the connection point, which is located between the first switching element 12 and the shunt resistor 30, and the connection point, which is located between the second switching element 22 and the shunt resistor 30. The resistive body 32 has one end connected to the sense terminal 100*e* and the other end connected to the sense terminal 100*f*. In other words, both ends of the resistor 32 are respectively connected to the sense terminals 100*e*, 100*f*.

The sense terminals 100*e*, 100*f* are connected to a current detector (not shown) for detecting the current flowing through the current path. The sense terminals 100*e*, 100*f* output a voltage across both ends of the resistive body 32 to the current detector. As a result, the voltage detector detects a voltage drop across the resistive body 32 and thus can detect a value of the current flowing through the current path.

The control terminals 100*c*, 100*d* is connected to a controller configured to control the on/off states of the switching elements 12, 22. The controller controls the on/off states of the switching elements 12, 22 by outputting a control signal to the control terminals 100*c*, 100*d*.

Thus, the controller determines whether the current flows through the current path. Specifically, it is possible to enable the current flowing bidirectionally to the current path as the controller turns on both of the switching elements 12, 22. The controller turns off both of the switching elements 12, 22 so that the current does not flow bidirectionally in the current path. Specifically, since the directions of restricting the respective currents through the parasitic diodes of the switching elements 12 and 22 are opposite to each other, the current flow in both directions are restricted in the current path when both of the switching elements 12, 22 are turned off. In other words, the controller turns off both of the switching elements 12, 22 so that the current does not flow through the current path regardless of the direction of the current.

The following describes the configuration of the semiconductor device 100 based on FIGS. 2 to 5.

Figure 2:
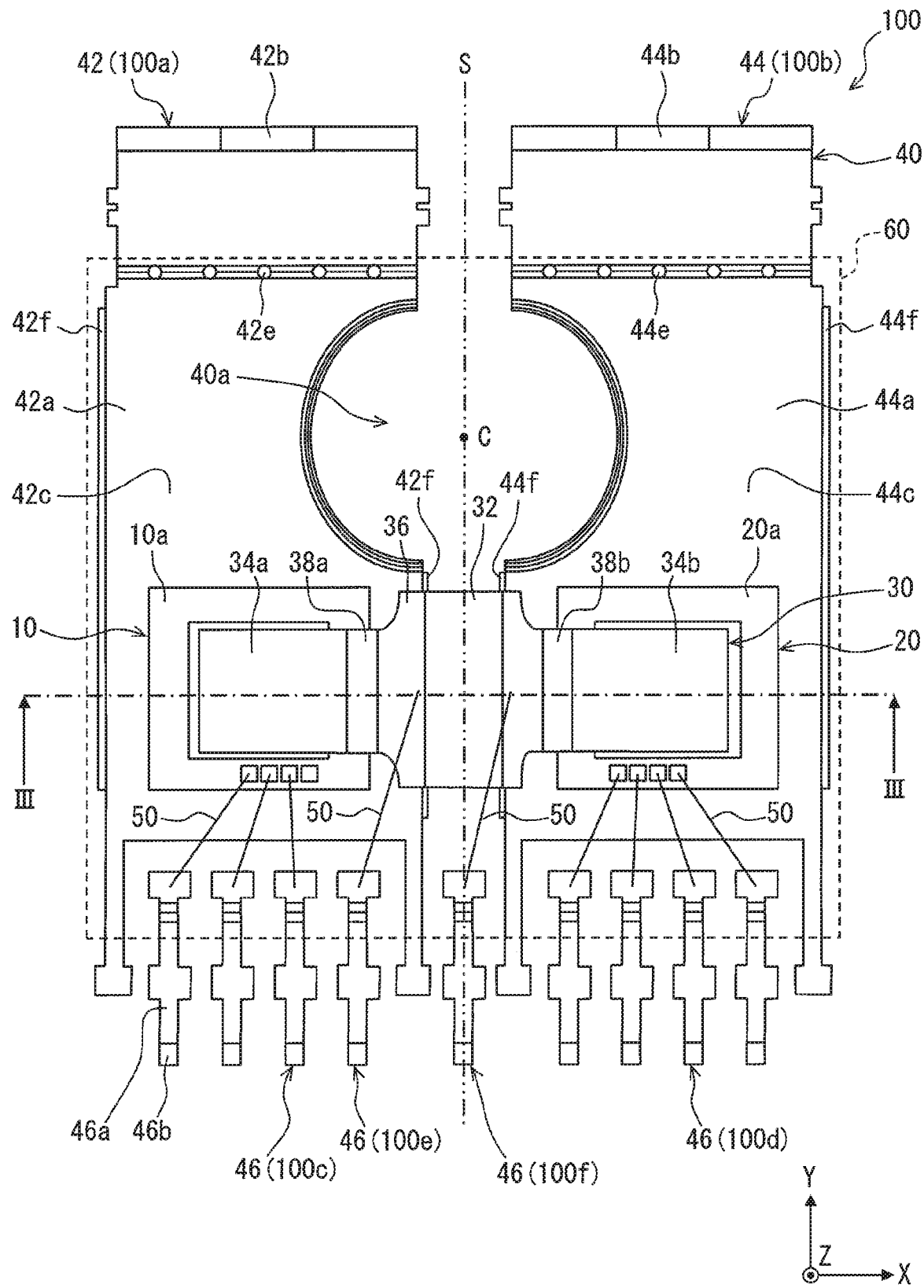
FIG. 2 is a plan view that illustrates the configuration of the semiconductor device.
Figure 3:
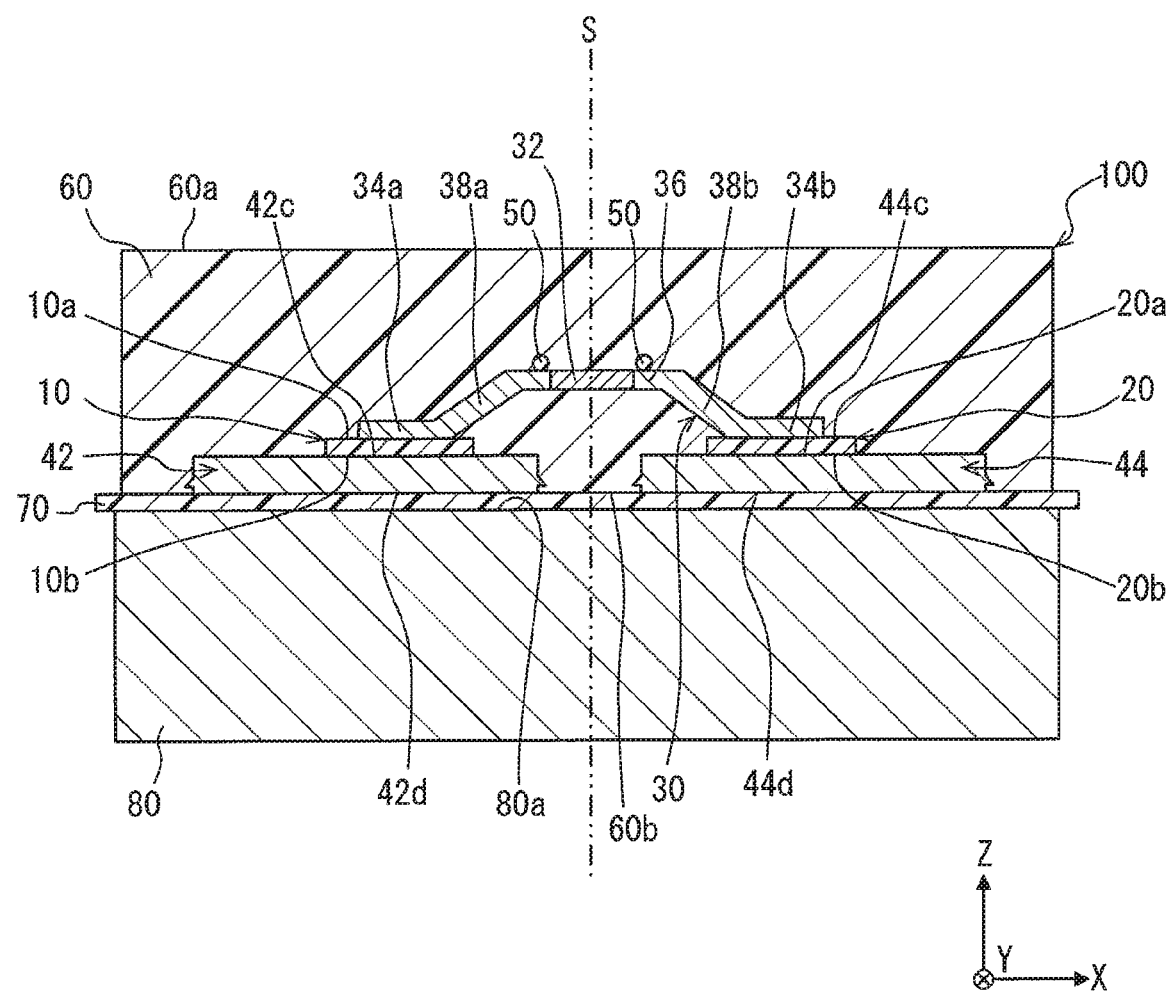
FIG. 3 is a cross-sectional view taken along the line III-III in FIG. 2.

As shown in FIG. 2, in an XY plane, the chips 10, 20 each have a rectangular shape in which each side is along the X-direction or Y-direction. As shown in FIG. 3, the chips 10, 20 each form a flat-plate shape whose the thickness direction is along the Z-direction.

The first chip 10 has a front surface 10*a* and a rear surface 10*b* as planar surfaces orthogonal to the Z-direction. The source electrode and the gate electrode of the first switching element 12 are formed at the front surface 10*a*. The drain electrode of the first switching element 12 is formed at the rear surface 10*b*.

The second chip 20 and the first chip 10 are formed substantially in the same shape. The two chips 10, 20 are aligned as viewed in the X-direction. The second chip 20 includes a front surface 20*a* and a rear surface 20*b* as planar surfaces orthogonal to the Z-direction. The source electrode and the gate electrode of the second switching element 22 are formed at the front surface 20*a*. The drain electrode of the second switching element 22 is formed at the rear surface 20*b*.

The second chip 20 is arranged at the same position as the first chip 10 as viewed in the Z-direction. More specifically, as viewed in the Z-direction, the position of the front surface 20*a* is the same as the position of the front surface 10*a*, and the position of the rear surface 20*b* is the same as the position of the rear surface 10*b*. The second chip 20 is arranged at the position similar to the position of the first chip 10 as viewed in the Y-direction.

The shunt resistor 30 has one end electrically and mechanically connected to the first chip 10, and the other end mechanically and electrically connected to the second chip 20. As a result, the shunt resistor 30 functions as the wiring connecting the first chip 10 and the second chip 20. The shunt resistor 30 is extended through the X-direction on the XY plane. The shunt resistor 30 is arranged at the front surface 10*a* side with respect to the first chip 10, and is also arranged at the front surface 20*a* side with respect to the second chip 20.

The resistive body 32 at the shunt resistor 30 has a larger resistivity as compared with the part of the shunt resistor 30 other than the resistive body 32. The resistive body 32 is formed, for example, CuMnSn or CuMnNi as a main component. The part of the shunt resistor 30 other than the resistive body 32 is formed by, for example, copper as a main component. As shown in FIG. 3, the shunt resistor 30 includes: fixing portions 34a, 34b respectively fixed to the chips 10, 20; a central portion 36 having the resistive body 32; and coupling portions 38a, 38b for coupling the fixing portions 34a, 34b and the central portion 36.

The fixing portion 34a forms one end of the shunt resistor 30. The fixing portion 34a is soldered to the source electrode of the front surface 10a. The fixing portion 34b forms another end opposite to the fixing portion 34a of the shunt resistor 30. The fixing portion 34b is soldered to the source electrode at the rear surface 10b. Plating treatment is applied to the electrode formed at the surfaces 10a, 20b so that soldering can be performed. The fixing portions 34a, 34b each have a flat-plate shape in which the thickness direction is along the Z-direction. In the XY plane, the fixing portions 34a and 34b are rectangular with each side extending along the X-direction or the Y-direction.

The width of the fixing portion 34a as viewed in the X-direction and the width of the fixing portion 34a as viewed in the Y-direction are shorter than those of the first chip 10. Similarly, the width of the fixing portion 34b as viewed in the X-direction and the width of the fixing portion 34b as viewed in the Y-direction are shorter than those of the second chip 20. In addition, in the projection view of the Z-direction, the entire fixing portion 34a overlaps with a portion of the first chip 10. Similarly, in the projection view of the Z-direction, the entire fixing portion 34b overlaps with a portion of the second chip 20.

The central portion 36 is arranged between the fixing portions 34a and 34b as viewed in the X-direction. That is, the central portion 36 is arranged between the chips 10 and 20 as viewed in the X-direction. The central portion 35 does not overlap with the chips 10, 20 in the projection view of the Z-direction. The central portion 36 is at the front surfaces 10a, 20b side with respect to the chips 10, 20 as viewed in the Z-direction, and is arranged at a position away from the surfaces 10a, 20a. That is, the central portion 36 is arranged at a position away from the fixing portions 34a, 34b as viewed in the Z-direction.

The central portion 36 has a flat-plate shape in which the thickness direction is along the Z-direction. The central portion 36 has a substantially rectangular shape in which each side is along the X-direction or the Y-direction. The width of the central portion 36 as viewed in the Y-direction is longer than the respective widths of the fixing portions 34a, 34b as viewed in the Y-direction. The width of the central portion 36 is substantially equal to those of the chips 10, 20 as viewed in the Y-direction. The central portion 36 is arranged at a position substantially the same as the respective positions of the chips 10, 20 as viewed in the Y-direction. The resistive body 32 is arranged at the center of the central portion 36 as viewed in the X-direction, and is extended from one end to the other end of the central portion 36 as viewed in the Y-direction.

The coupling portion 38a is arranged between the fixing portion 34a and the central portion 36 as viewed in the X-direction, and couples with the fixing portion 34a and the central portion 36. The coupling portion 38b is arranged between the fixing portion 34b and the central portion 36 as viewed in the X-direction, and couples with the fixing portion 34b and the central portion 36. According to the above, the fixing portion 34a, the coupling portion 38a, the central portion 36, the coupling portion 38b and the fixing portion 34b are aligned in order as viewed in the X-direction.

The coupling portions 38a, 38b form in a rectangular shape as viewed in the XY plane. The respective widths of the coupling portions 38a, 38b as viewed in the Y-direction are equal to those of the fixing portions 34a, 34b. The coupling portions 38a, 38b are arranged at the positions similar to those of the fixing portions 34a, 34b as viewed in the Y-direction. The coupling portions 38a, 38b as viewed in the ZX plane is extended in a linear shape forming a predetermined angle with respect to the Z-direction and the X-direction. In the projection view of the Z-direction, a portion of the coupling portion 38a overlaps with a portion of the first chip 10. Similarly, as viewed in the projection view of the Z-direction, a portion of the coupling portion 38b overlaps with a portion of the second chip 20.

Figure 5:
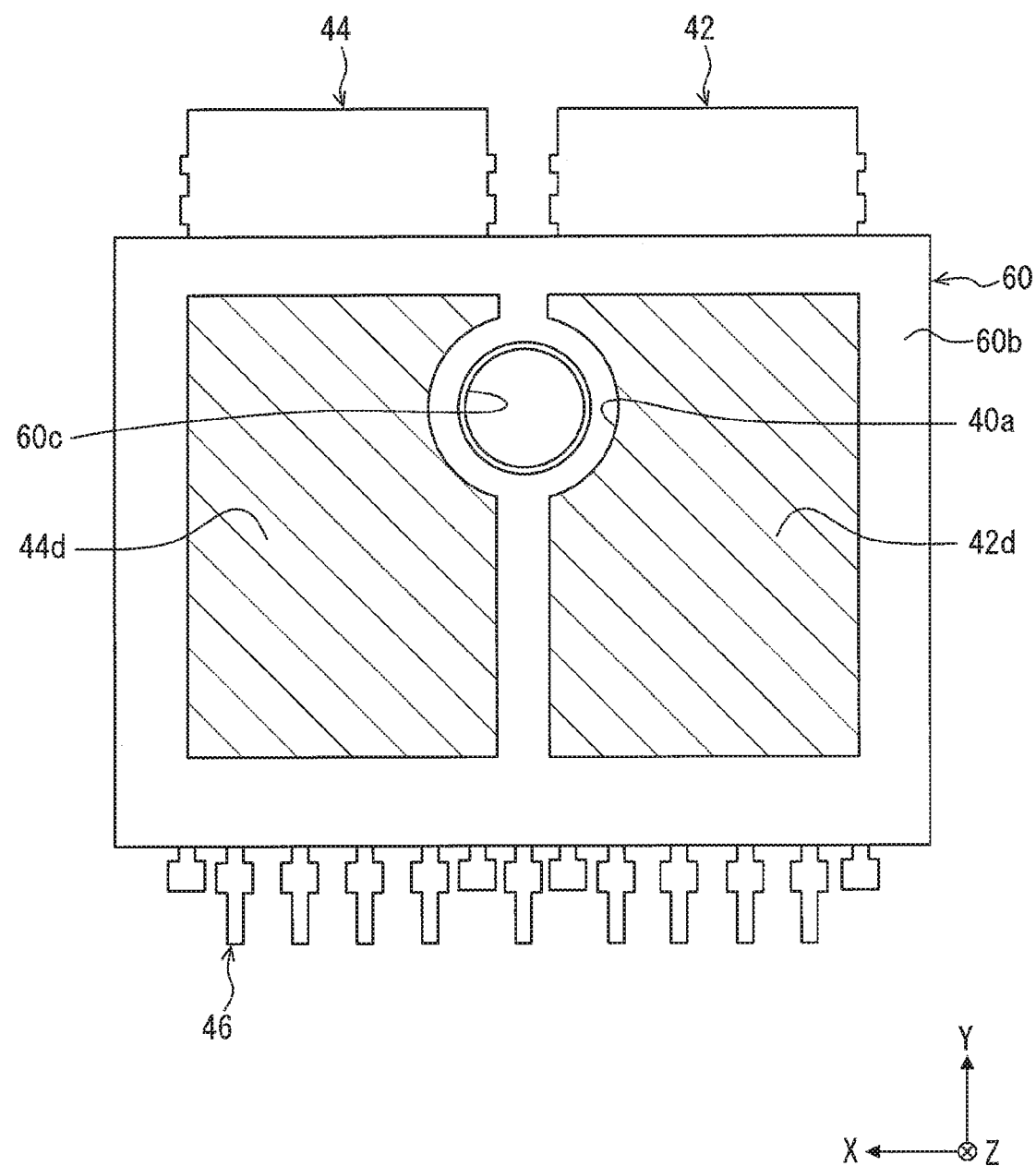
FIG. 5 is a plan view that illustrates the structure of the semiconductor device.

The semiconductor device 100 includes the first chip 10, the second chip 20 and the shunt resistor 30. The semiconductor device 100 further includes a lead frame 40, a bonding wire 50, a molding resin 60, an insulating sheet 70, a heat sink 80 and a screw 90. In FIG. 2, the illustration of the screw 90 is omitted. In FIG. 5, the illustration of the insulating sheet 70, the heat sink 80 and the screw 90 is omitted.

The lead frame 40 fixes the chips 10, 20, and forms the current path. The lead frame 40 is formed with the use of a metal material. The lead frame 40 includes a first lead 42, a second lead 44 and a plurality of pins 46.

The first chip 10 is fixed and arranged at the first lead 42, and the external wiring is connected to the first lead 42. The first lead 42 corresponds to the first terminal 100a of the semiconductor device 100, and forms the current path. The first lead 42 is formed with a bent metal plate. More specifically, the first lead 42 includes: a flat plate portion 42a in which the thickness direction is along the Z-direction; and a flat plate portion 42b in which the thickness direction is along the Y-direction.

The flat plate portion 42a is the portion to which the first chip 10 is fixed. The flat plate portion 42a includes a front surface 42c and a rear surface 42d facing the front surface 42c as viewed in the Z-direction. The front surface 42c and the rear surface 42d are planes orthogonal to the Z-direction. The first chip 10 is arranged at the front surface 42c. By soldering the front surface 42c to the rear surface 10b, the first lead 42 is mechanically and electrically connected to the first chip 10. Thus, the first lead 42 is connected to the drain electrode of the first switching element 12. The flat plate portion 42a as viewed in the projection view of the Z-direction overlaps with a part of the first chip 10, the fixing portion 34a, the coupling portion 38a, and the central portion 36.

The flat plate portion 42b is the portion to be connected to the external wiring. The flat plate portion 42b is connected to one end of the flat plate portion as viewed in the Y-direction. The flat plate portion 42b is bent from the flat plate portion 42a toward the first chip 10 as viewed in the Z-direction.

The second chip 20 is fixed and arranged at the second lead 44, and the external wiring is connected to the second lead 44. The second lead 44 corresponds to the second terminal 100b of the semiconductor device 100, and forms the current path.

Figure 4:
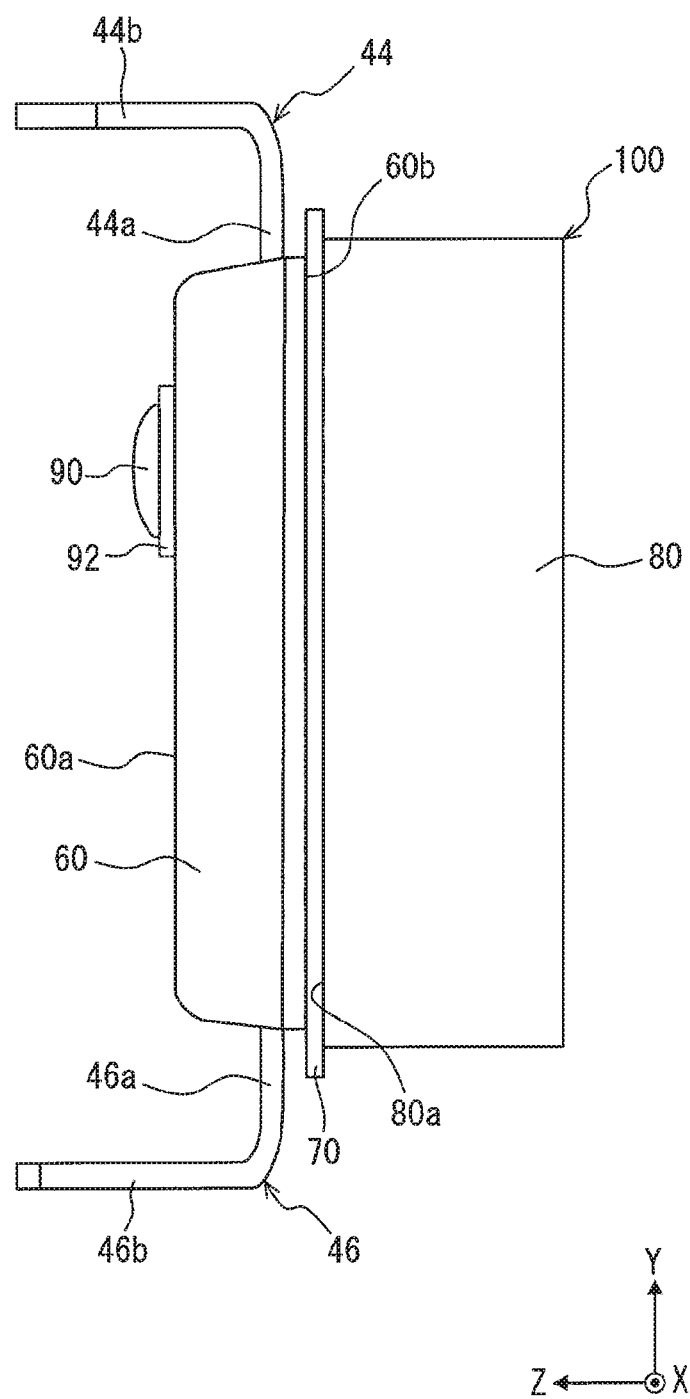
FIG. 4 is a side view that illustrates the structure of the semiconductor device.

The second lead 44 forms a shape symmetrical to the first lead 42 with respect to the symmetrical surface S orthogonal to the X-direction. That is, the second lead 44 has a plane forms a shape symmetrical to the first lead 42. Thus, as shown in FIGS. 2 and 4, the second lead 44 is formed with a bent metal plate. In FIGS. 2 and 3, the symmetrical plane S is indicated by a two-dot chain line.

The symmetrical plane S passes through the center of the shunt resistor 30 at the X-direction. The shunt resistor 30 has a symmetrical shape with respect to the symmetrical plane S. The first chip 10 is disposed at a position symmetrical to the second chip 20 with respect to the symmetrical plane S.

The second lead 44 includes a flat plate portion 44a whose thickness direction is along the Z-direction and a flat plate portion 44b whose thickness direction is along the Y-direction. The flat plate portion 44a includes a front surface 44c and a rear surface 44d facing the front surface 42c as viewed in the Z-direction. The front surface 44c and the rear surface 42d are flat surfaces orthogonal to the Z-direction. The second chip 20 is arranged at the front surface 44c. By soldering the front surface 44c to the rear surface 10b, the second lead 44 are mechanically and electrically to the second chip 20. Thus, the second lead 44 is connected to the drain electrode of the second switching element 22.

The second lead 44 is arranged at a position similar to the first lead 42 as viewed in the Z-direction. More specifically, as viewed in the Z-direction, the position of the front surface 44c is similar to the position of the front surface 42c, and the position of the rear surface 44d is similar to the position of the rear surface 42d. Thus, the respective positions of the chips 10, 20 are similar as viewed in the Z-direction. The flat plate portion 44a in the projection view of the Z-direction overlaps with a part of the second chip 20, the fixing portion 34b, the coupling portion 38b and the central portion 36. The flat plate portion 44b is connected to one end of the flat plate portion 44a as viewed in the Y-direction. The flat plate portion 44b is bent from the flat plate portion 44a toward the second chip 20 as viewed in the Z-direction.

A hole 40a through which the screw 90 passes is formed at the flat plate portions 42a and 42b. The hole 40a has a substantially perfect circular shape as viewed in the XY plane. The hole 40a is formed by a region between the flat plate portion 42a and the flat plate portion 44a as viewed as viewed in the X-direction. The flat plate portion 42a has a side surface facing the flat plate portion 44a, and the side surface is recessed in a semicircular shape as viewed in the X-direction. Similarly, the flat plate portion 44b has a side surface facing the flat plate portion 42a, and the side surface is recessed in a semicircular shape as viewed in the X-direction. The hole 40a is formed by a recess at the respective side surfaces of the flat plate portions 42a, 44a.

In the projection view of the Z-direction, the hole 40a is formed at a position without overlapping with the first chip 10, the second chip 20 and the shunt resistor 30. In the present embodiment, the hole 40a in the projection view of the Z-direction is formed at one side of the central portion 36 as viewed in the Y-direction.

Hereinafter, the center of the hole 40a as viewed in the XY plane is indicated as the center C. The symmetrical plane S, which is the reference of plane symmetry between the leads 42 and 44, passes through the center C. In other words, as viewed in the X-direction, the position of the symmetrical plane S is the same as the position of the center C. In the present embodiment, as viewed in the XY plane, the shortest distance between the center C of the hole 40a and the first chip 10 is the same as the shortest distance between the center C and the second chip 20.

The penetrating holes 42e and 44e, which penetrate in the Z-direction, are respectively formed at the leads 42 and 44. By arranging the molding resin 60 in the penetrating holes 42e and 44e, the connection strength between the lead frame 40 and the molding resin 60 is improved. Grooves are formed around the periphery of the hole 40a between the surfaces 42c and 44c and around the opening of the penetrating holes 42e and 44e. By arranging the molding resin 60 at the groove, the connection strength between the lead frame 40 and the molding resin 60 is improved. The leads 42, 44 respectively have protrusions 42f, 44f each protruding from both end surfaces as viewed in the X-direction. Due to the anchor effect by the protrusions 42f, 44f, the connection strength between the lead frame 40 and the molding resin 60 is improved.

The pin 46 has one end connected to the first chip 10, the second chip 20 or the shunt resistor 30 through the bonding wire 50, and has the other end connected to the external wiring. The lead frame 40 in the present embodiment has nine pins 46. However, the number of pins is not limited to nine.

The pin 46 is arranged to be at a side opposite to the flat plate portion 42b of the first lead 42 as viewed in the Y-direction, is arranged to be at a side opposite to the flat plate portion 44b of the second lead 44 as viewed in the Y-direction, and is arranged to be at a side opposite to the hole 40a of the central portion 36 as viewed in the Y-direction. Nine pins 46 are aligned as viewed in the X-direction.

The pin 46 forms a bent-rod shape. The pin 46 includes a pillar portion 46a extending in the Y-direction, and a pillar portion 46b extending in the Z-direction. One end of the pillar portion 46a is connected to the bonding wire 50. The pillar portion 46a includes one end connected to the bonding wire 50 and the other end coupled with the pillar portion 46a. The pillar portion 46b extends from the pillar portion 46a in a direction, which is the same as the direction in which the flat plate portion 42b as viewed in the Z-direction extends from the flat plate portion 42a. The pillar 46b is connected to the external wiring.

Three pins 46 are connected to the first chip 10 electrically and mechanically through the bonding wire 50. The bonding wire 50 electrically relays the pin 46 and the first chip 10. The bonding wire 50 includes one end connected to the pillar portion 46a and the other end connected to an electrode formed at the front surface 10a of the first chip 10.

One of the three pins 46 connected to the first chip 10 corresponds to the control terminal 100c, and is connected to the gate of the first switching element 12. The pin 46 corresponding to the control terminal 100c is connected to the controller for controlling the on/off state of the first switching element 12 through the pillar portion 46b. The controller transmits a control signal to the gate of the first switching element 12 through the pin 46 and the bonding wire 50. The remaining two of the three pins 46 connected to the first chip 10 are connected to elements other than the first switching element 12 formed at the first chip 10.

Four pins 46 are connected to the second chip 20 mechanically and electrically through the bonding wire 50. The bonding wire 50 electrically relays the pin 46 and the second chip 20. The bonding wire 50 includes one end connected to the pillar portion 46a and the other end connected to an electrode formed at the front surface 20a of the second chip 20.

One of the four pins connected to the second chip 20 corresponds to the control terminal 100d, and is connected to the gate of the second switching element 22. The pin 46 corresponding to the control terminal 100d is connected to the controller by the pillar portion 46b. The controller transmits a control signal to the gate of the second switching element 22 through the pin 46 and the bonding wire 50. The remaining three of the four pins 46 connected to the second chip 20 is connected to elements other than the second switching element 22 formed at the second chip 20.

Two pins 46 correspond to the sense terminals 100e, 100f, and are connected to the shunt resistor 30 electrically and mechanically through the bonding wire 50. One of the two pins 46 is connected to one end side of the resistive body 32 through the bonding wire 50, and the other one of the two pins 46 is connected to the other end side of the resistive body 32 through the bonding wire 50. It is noted that the bonding wire 50 to be connected with the shunt resistor 30 is a portion of the central portion 35 other than the resistive body 32, and is connected to a portion near the central portion 36.

The pins 46 corresponding to the sense terminals 100e and 100f are connected to the current detector by the pillar portion 46b. The current detector detects a voltage across both ends of the resistive body 32 through the bonding wire 50 and the pin 46.

The solder that does not leave flux residue after heating is adopted as the solder connecting the leads 42, 44 and chips 10, 20 and the solder connecting the chips 10, 20 and the shunt resistor 30. Accordingly, it is possible to restrict the inhibition of the connection of the bonding wire 50 due to the flux residue.

The molding resin 60 integrally seals the first chip 10, the second chip 20, the shunt resistor 30 and the lead frame 40. Accordingly, the molding resin 60 holds the first chip 10, the second chip 20, the shunt resistor 30 and the lead frame 40.

The molding resin 60 includes a main surface 60a orthogonal to the Z-direction and a base surface 60b facing the main surface 60a as viewed in the Z-direction. The main surface 60a is at a position away from the shunt resistor 30 at a side opposite to the chips 10, 20 with respect to the shunt resistor 30. The molding resin 60 forms a symmetrical shape with respect to the symmetrical surface S.

The base surface 60b is at a position similar to the respective positions of the rear surfaces 42d, 44d as viewed in the Z-direction, or is at a position slightly away from the main surface 60a than the rear surfaces 42d, 44d. Thus, as shown in FIGS. 3 and 5, the rear surfaces 42d, 44d are exposed from the molding resin 60. In FIG. 5, hatching lines are illustrated at the rear surfaces 42d, 44d for clarifying the shape of the rear surfaces 42d, 44d.

With regard to the first lead 42, a portion of the flat plate portion 42a and the entire flat plate portion 42b are exposed from the molding resin 60. Thus, the flat plate portion 42b can be connected to the external wiring. With regard to the second lead 44, a portion of the flat plate portion 44a and the entire flat plate portion 44b expose from the molding resin 60. Thus, the flat plate portion 44b can be connected to the external wiring. With regard to the pin 46, a portion of the pillar portion 46a and the entire pillar portion 46b expose from the molding resin 60. Thus, the pillar portion 46b can be connected to the external wiring.

A penetrating hole 60c through which the screw 90 passes is formed at the molding resin 60. The penetrating hole 60c penetrates the molding resin 60 as viewed in the Z-direction. The diameter of the penetrating hole 60c is smaller than the diameter of the hole 40a as viewed in the XY plane.

The insulating sheet 70 is formed with the use of an electrically insulating material. The insulating sheet 70 is interposed between the lead frame 40 and the heat sink 80, and is electrically insulated to the lead frame 40 and the heat sink 80. The insulating sheet 70 forms a flat plate shape whose thickness direction is along the Z-direction. The insulating sheet 70 is placed in contact with the rear surface 42d, the rear surface 44d and the base surface 60b. The insulating sheet 70 is formed in a symmetrical shape with reference to the symmetrical surface S.

A penetrating hole through which the screw 90 passes is formed at the insulating sheet 70. The penetrating hole of the insulating sheet 70 extends in the Z-direction and communicates with the penetrating hole 60c of the molding resin 60. The heat sink 80 is arranged at a side of the insulating sheet 70 facing the lead frame 40 and the molding resin 60.

The heat sink 80 dissipates the heat of the chips 10, 20 to outside. The heat sink 80 is formed with the use of a metal material. The heat sink 80 forms a cubic shape with each side is along the X-direction, the Y-direction or the Z-direction. The heat sink 80 includes a contact surface 80, which is in contact with the insulating sheet 70. The contact surface 80 is a flat surface orthogonal to the Z-direction. The heat of the chips 10, 20 is conducted to the heat sink 80 through the leads 42, 44 and the insulating sheet 70, and is dissipated to outside from the heat sink 80.

The heat sink 80 is formed with a screw hole to be fastened with the screw 90. The screw hole of the heat sink 80 is formed to have a predetermined depth as viewed in the Z-direction from the contact surface 80a. The screw hole of the heat sink 80 communicates with the penetrating hole 60c of the molding resin 60 and the penetrating hole of the insulating sheet 70. The heat sink 80 has a symmetrical shape with reference to the symmetrical plane S.

The screw 90 fixes the molding resin 60, the insulating sheet 70 and the heat sink 80 to each other. The screw 90 passes through the penetrating hole 60c of the molding resin 60 and the penetrating hole of the insulating sheet 70, and is fastened to the screw hole of the heat sink 80. The head portion of the screw 90 is arranged at the main surface 60a of the molding resin 60 through a washer 92.

The screw 90 presses the lead frame 40 and the molding resin 60 against the insulating sheet 70 and the heat sink 80. Thus, a gap is not formed between lead frame 40 and the molding resin 60 and the insulating sheet 70. Additionally, a gap is not formed between the insulating sheet 70 and the heat sink 80.

The following describes the effects of the above-mentioned semiconductor device 100.

In the present embodiment, the chips 10, 20 are connected by the shunt resistor 30 for detecting the current flowing through the current path. Accordingly, the wiring can be omitted in the configuration of providing the shunt resistor 30 separately from the wiring connecting the chips 10, 20. Thus, an increase in the number of components of the semiconductor device 100 can be restricted.

In the present embodiment, the respective rear surfaces 42d and 44d of the leads 42, 44 are exposed from the molding resin 60. As compared with the configuration in which the rear surfaces 42d, 44d is covered by the molding resin, the heat of the chips 10, 20 is easily to be dissipated from the rear surfaces 42d, 44d. Thus, it is possible to effectively suppress the high temperature of the chips 10, 20.

The leads 42, 44 in the present embodiment are symmetrical with reference to the symmetrical surface S orthogonal to the direction in which the chips 10, 20 are aligned. That is, the shape of the first lead 42, which is the heat dissipation path of the first chip 10, is symmetrical with the shape of the second lead 44, which is the heat dissipation path of the second chip 20. Accordingly, the amount of heat dissipation from the first chip 10 to the first lead 42 can be made closely equal to the amount of heat dissipation from the second chip 20 to the second lead 44. Thus, it is possible to suppress the temperature of one of the chips 10, 20 from being higher than the temperature of the other chip.

In the present embodiment, the insulating sheet 70 is electrically insulated to the lead frame 40 and the heat sink 80, and the heat sink 80 dissipates the heat of the chips 10, 20. Accordingly, as compared with the semiconductor device 100 without having the insulating sheet 70 and the heat sink 80, it is possible to effectively suppress the temperature of the chips 10, 20 getting higher.

The lead frame 40, the insulating sheet 70 and the heat sink 80 may be fixed to each other through an adhesive material. In this situation, the heat of the chips 10, 20 passes through the adhesive material as a heat conducting path. In contrast, the lead frame 40, the insulating sheet 70 and the heat sink 80 are screwed together in the present embodiment. Accordingly, the heat of the chips 10, 20 is directly conducted from the leads 42, 44 to the insulating sheet 70, and is directly conducted from the insulating sheet 70 to the heat sink 80. Thus, the heat of the chips 10, 20 is easily conducted to the heat sink, and it is possible to effectively suppress the temperature of the chips 10, 20 getting higher.

Since the leads 42, 44 are pressed towards the heat sink 80 through the screw 90, a portion of the leads 42, 44 near the hole 40a through which the screw passes allows heat to be easily conducted to the heat sink 80. On the other hand, in the present embodiment, the shortest distance between the chip 10 and the center C of the hole 40a and the shortest distance between the chip 20 and the center C of the hole 40a are equal. Therefore, the amount of heat dissipation from the first chip 10 to the first lead 42 can be made to be closer to the amount of heat dissipation from the second chip 20 to the second lead 44. Thus, it is possible to effectively suppress the temperature of one of the chips 10, 20 getting higher.

In the present embodiment, the symmetrical plane S as the reference of plane symmetry between the leads 42 and 44 passes through the center C of the hole 40a. Accordingly, the shape of a portion of the first lead 42 where the heat is particularly to be dissipated easily is symmetrical to a portion of the second lead 44 where the heat is particularly to be dissipated easily. Thus, the amount of heat dissipation from the chip 10 to the lead 42 and the amount of heat dissipation from the chip 20 to the lead 44 can be made closely equal to each other, and it is possible to effectively suppress one of the chips 10, 20 from rising to a temperature higher than the temperature of the other chip.

Other Embodiments

The present disclosure has been described in compliance with the embodiments, but the present disclosure is understood as not being limited to the embodiments and structures. The present disclosure encompasses various modifications and variations within the scope of equivalents. In addition, various combinations and configurations, as well as other combinations and configurations that include only one element, more, or less, fall within the scope and spirit of the present disclosure.

The above-mentioned embodiment illustrates an example where the semiconductor device 100 includes the insulating sheet 70 and the heat sink 80. However, it is not limited to this particular example. An example in which the semiconductor device 100 is without having the insulating sheet 70 and the heat sink 80 may also be adopted. For example, the respective rear surfaces 42d, 44d of the leads 42, 44 exposed from molding resin 60 may be in contact with air around the semiconductor device 100.

The present embodiment illustrates an example where the switching elements 12, 22 are MOSFETs. However, it is not limited to this particular example. For example, bipolar transistors or IGBTs may also be used as the switching elements 12, 22. Furthermore, the switching elements 12, 22 may be devices different from each other.

The invention claimed is:

1. A semiconductor device connected to a current path through which a current flows bidirectionally and provided as a part of the current path, the semiconductor device comprising:
   a first chip that has a first switching element to restrict current flow in a first direction through the current path when the first switching element is turned off;
   a second chip that has a second switching element to restrict the current flow in a second direction, which is opposite to the first direction, through the current path when the second switching element is turned off;
   a wiring that has one end connected to the first chip and another end connected to the second chip, and that is provided as a part of the current path by relaying the first chip and the second chip;
   a lead frame that includes a first lead arranged and fixed with the first chip and a second lead arranged and fixed with the second chip, and that provides the current path;
   molding resin that integrally seals the first chip, the second chip, the wiring, and the lead frame;
   a heat sink that is arranged at a side opposite to the first chip and the second chip with respect to the lead frame, and that dissipates heat of the first chip and the second chip; and
   an insulating sheet that is interposed between the lead frame and the heat sink, and that electrically insulates the lead frame and the heat sink, wherein:
   the wiring is a shunt resistor that has a resistive body to detect the current flowing through the current path, and that is extended in an aligning direction of the first chip and the second chip;
   the lead frame further includes a sense terminal connected to both ends of the resistive body of the wiring to detect a voltage drop across the resistive body;
   the sense terminal is arranged on a side of the shunt resistor in a direction orthogonal to the aligning direction;
   the first lead and the second lead respectively have end portions correspondingly connected with the first chip and the second chip, and respectively are extended from the end portions toward another side opposite to the sense terminal with respect the shunt resistor;
   each of the lead frame, the insulating sheet, the heat sink, and the molding resin is provided with a hole; and
   the lead frame, the insulating sheet, the heat sink, and the molding resin are mutually fasted with a fastener penetrating through the hole of the lead frame, the insulating sheet, the heat sink, and the molding resin.

2. The semiconductor device according to claim 1, wherein:
   a surface of the first lead opposite to the first chip and a surface of the second lead opposite to the second chip are exposed from the molding resin.

3. The semiconductor device according to claim 1, wherein:
   the first lead and the second lead are respectively formed in shapes symmetrical to each other with reference to a symmetrical plane perpendicular to the aligning direction.

4. The semiconductor device according to claim 1, wherein:
the fastener that mutually fastens the lead frame, the insulating sheet, and the heat sink is a screw.

5. The semiconductor device according to claim 4, wherein:
the lead frame is provided with a hole, which is fastened with the screw, in a thickness direction of the lead frame; and
a shortest distance between the first chip and the center of the hole and a shortest distance between the second chip and the center of the hole are equal in a plane orthogonal to the thickness direction.

6. The semiconductor device according to claim 4, wherein:
the lead frame is provided with a hole, which is fastened with the screw, in a thickness direction of the lead frame; and
the first lead and the second lead are respectively formed in shapes symmetrical to each other with reference to a symmetrical plane passing through the center of the hole and along the thickness direction.

7. The semiconductor device according to claim 1, wherein:
the first switching element and the second switching element are configured to cause the current flowing bidirectionally to the current path when the first switching element and the second switching element are turned on; and
the first switching element and the second switching element are configured to restrict the current flowing bidirectionally to the current path when the first switching element and the second switching element are turned off.

* * * * *